United States Patent

Bakhru et al.

Patent Number: 5,196,251
Date of Patent: Mar. 23, 1993

[54] CERAMIC SUBSTRATE HAVING A PROTECTIVE COATING THEREON AND A METHOD FOR PROTECTING A CERAMIC SUBSTRATE

[75] Inventors: Nanik Bakhru, Danbury, Conn.; Richard A. Bates, Wappingers Falls, N.Y.; George Czornyj; Nunzio DiPaolo, both of Poughkeepsie, N.Y.; Ananda H. Kumar, Hopewell Junction, N.Y.; Suryanarayana Mukkavilli, Corton On Hudson, N.Y.; Heinz O. Steimel, Fishkill, N.Y.; Rao R. Tummala, Hopewell Junction, N.Y.

[73] Assignee: International Business Machines Corporation, Armonk, N.Y.

[21] Appl. No.: 693,746

[22] Filed: Apr. 30, 1991

[51] Int. Cl.⁵ .............................. B32B 9/00
[52] U.S. Cl. ........................ 428/76; 428/195; 428/209; 428/901; 174/255; 174/256; 174/264; 174/267
[58] Field of Search ............ 174/255, 256, 264, 267; 428/76, 195, 209, 901

[56] References Cited

U.S. PATENT DOCUMENTS

| | | | |
|---|---|---|---|
| 4,048,356 | 9/1977 | Bakos et al. | 427/379 |
| 4,233,620 | 11/1980 | Darrow et al. | 357/74 |
| 4,360,559 | 11/1982 | Dalencon | 428/174 |
| 4,427,715 | 1/1984 | Harris | 427/96 |
| 4,592,944 | 6/1984 | Clark et al. | 428/195 |
| 4,737,395 | 4/1988 | Mabuchi et al. | 428/76 |
| 4,755,631 | 7/1988 | Churchwell et al. | 174/256 |
| 4,880,684 | 11/1989 | Boss et al. | 428/209 |
| 4,890,157 | 12/1989 | Wilson et al. | 174/256 |
| 5,006,673 | 4/1991 | Freyman et al. | 174/264 |

FOREIGN PATENT DOCUMENTS

| | | |
|---|---|---|
| 0198976 | 10/1986 | European Pat. Off. |
| 0346035 | 12/1989 | European Pat. Off. |
| 0384036 | 8/1990 | European Pat. Off. |
| 2854916 | 12/1978 | Fed. Rep. of Germany |
| 61-38948 | 7/1985 | Japan |

OTHER PUBLICATIONS

IBM Technical Disclosure Bulletin, vol. 26, No. 8, Jan. 1984, p. 4013, "Metallurgy System for Pin Attachment to MLC".

Primary Examiner—Patrick J. Ryan
Assistant Examiner—W. Krynski
Attorney, Agent, or Firm—Ira David Blecker

[57] ABSTRACT

Disclosed is a ceramic substrate having a protective coating on at least one surface thereof which includes: a ceramic substrate having at least one electrically conductive via extending to a surface of the substrate; an electrically conductive I/O pad electrically connected to at least one of the vias; an I/O pin brazed to the I/O pad, the brazed pin having a braze fillet; and a protective layer of polymeric material fully encapsulating the I/O pad, wherein the layer of polymeric material protects the I/O pad from corrosion.

Also disclosed is a method of protecting a ceramic substrate from corrosion, the ceramic substrate of the type having a plurality of electrically conductive vias extending to a surface of the substrate, a multilayer metallic I/O pad electrically connected to at least one of the vias, and an I/O pin brazed to the I/O pad, the brazed pin having a braze fillet, the method comprising the step of:

encapsulating fully the I/O pad with a protective layer of polymeric material, wherein the layer of polymeric material protects the I/O pad from corrosion.

In a preferred embodiment, the I/O pin is selectively exposed to plasma ashing to remove any errant polymeric material from the pin shank, thereby assuring electrical contact to the pin shank.

29 Claims, 1 Drawing Sheet

CERAMIC SUBSTRATE HAVING A PROTECTIVE COATING THEREON AND A METHOD FOR PROTECTING A CERAMIC SUBSTRATE

BACKGROUND OF THE INVENTION

This invention relates to the field of hermetic ceramic substrates for microelectronic applications. More particularly, this invention relates to protective surface layers for providing hermeticity and corrosion protection.

In the microelectronics environment, there is a need for high density, high strength packaging to provide interconnection between semiconductor devices and connection from the devices to the electrical power supply. The electrical properties which are desirable include a highly conductive medium in a highly insulative carrier medium having a low dielectric constant. Thermally, the package must withstand not only the operating environment but also the thermal excursions encountered during the processing and fabrication of the part.

Mechanically, it is preferable to have a substrate package which can withstand chip and pin joining stresses and stresses related to interconnecting with the next level of packaging.

The packaging should also be hermetic to prevent degradation of any of the desired properties due to adverse environmental effects. In particular, corrosion of any of the metallurgies used in the package is a real concern if not adequately protected from ambient moisture and deleterious ionic contaminants.

Boss et al. U.S. Pat. No. 4,880,684, the disclosure of which is incorporated by reference herein, discloses the present day state of the art for the bottom surface of a ceramic substrate. Thus, there is a capture pad, a polymeric sealing and stress relief layer followed by an I/O (conventional nomenclature meaning "input/output") bonding pad. Thereafter, the I/O pin is brazed to the I/O bonding pad.

It has recently been discovered by the present inventors, however, that there is a concern with the structure disclosed by Boss et al. The I/O bonding pad is typically made from a plurality of layers of metallic material. The present inventors have found the presence of corrosion at this I/O bonding pad during reliability testing which has led to premature failure of the I/O pad structure. While not wishing to be held to a particular theory, it is believed by the present inventors that the corrosion of the I/O bonding pad occurs by a galvanic corrosion mechanism wherein the less noble metals become anodic to the more noble metals in the presence of a suitable electrolyte such as water. At the edges of the I/O bonding pad, the different metals of the pad are exposed together to the environment which thus allow these deleterious corrosion cells to form.

It has thus been proposed by the present inventors to apply a protective coating to the bottom surface of the ceramic substrate after the pins have been attached to protect the edges of the I/O bonding pads.

Various solutions have been proposed to protect electronic substrates from the effects of corrosion.

Bakos et al. U.S. Pat. No. 4,048,356, the disclosure of which is incorporated by reference herein, discloses in general the application of a hermetic topsealant for the active areas of an integrated circuit device.

Darrow et al. U.S. Pat. No. 4,233,620, the disclosure of which is incorporated by reference herein, discloses the application of an epoxy material to the surface of a substrate having electrically conductive pins protruding therefrom and to the sides of the substrate so as to hermetically seal the backside of the substrate containing a chip in a cap. Such arrangements wherein epoxy is applied are typically not reworkable, a disadvantage for many ceramic substrates such as those contemplated by the present inventors wherein reworkability is a necessity. Additionally, epoxies are not suitable for the substrates contemplated by the present inventors because epoxies are brittle which could lead to their cracking. Manifestly, such cracking destroys any advantage epoxies may have as a barrier material. The poor thermal stability of epoxies is yet another disadvantage.

Dalencon U.S. Pat. No. 4,360,559, the disclosure of which is incorporated by reference herein, discloses the application of a protective varnish to a printed circuit card, including the weld area of the pins.

Harris U.S. Pat. No. 4,427,715, the disclosure of which is incorporated by reference herein, discloses an inorganic passivation layer such as polysilicon glass or vapox overlapping the edge of the bonding pad that is applied prior to the bonding operation. The patent is directed to a structure for TAB bonding pads on semiconductor chips that is aimed at preventing the cracking of the chip during the thermo-mechanical bonding process.

Clark et al. U.S. Pat. No. 4,592,944, the disclosure of which is incorporated by reference herein, discloses a polymeric coating over the top surface of substrates for corrosion protection, insulation, etc. The corrosion protection is directed at the top surface thin film circuitry and solder connections.

Notwithstanding the numerous solutions and disclosures proposed by those familiar with electronic substrates, there still remains a very real need to solve the problem discovered by the present inventors, namely, the corrosion of the I/O bonding pad due to corrosive effects.

Accordingly, it is an object of the present invention to solve the problem of I/O bonding pad corrosion by providing a protective layer over the I/O bonding pads to insulate them from the deleterious effects of corrosion.

This and other objects of the invention will become apparent to those skilled in the art after referring to the following description considered in conjunction with the accompanying drawings.

BRIEF SUMMARY OF THE INVENTION

One aspect of the invention relates to a ceramic substrate having a protective coating on at least one surface thereof comprising:

a ceramic substrate having at least one electrically conductive via extending to a surface of said substrate;

an electrically conductive I/O pad electrically connected to said at least one via;

an I/O pin brazed to said I/O pad, said brazed pin having a braze fillet; and a protective layer of polymeric material fully encapsulating said I/O pad wherein said layer of polymeric material protects said I/O pad from corrosion.

Another aspect of the invention relates to a ceramic substrate having a protective coating on at least one surface thereof comprising:

a ceramic substrate having at least one electrically conductive via extending to a surface of said substrate;

an electrically conductive capture pad on said surface and in electrical contact with said at least one via;

a stress relief layer of polymeric material on said surface and disposed over said electrically conductive capture pad;

an electrically conductive I/O pad disposed over said stress relief layer of polymeric material and electrically connected to said at least one via through said capture pad;

an I/O pin brazed to said I/O pad, said brazed pin having a braze fillet; and a protective layer of polymeric material fully encapsulating said I/O pad, wherein said layer of polymeric material protects said I/O pad from corrosion.

A final aspect of the invention relates to a method of protecting a ceramic substrate from corrosion, the ceramic substrate of the type having a plurality of electrically conductive vias extending to a surface of the substrate, a multilayer metallic I/O pad electrically connected to at least one of the vias, and an I/O pin brazed to the I/O pad, the brazed pin having a braze fillet, the method comprising the step of:

encapsulating fully the I/O pad with a protective layer of polymeric material, wherein said layer of polymeric material protects the I/O pad from corrosion.

DETAILED DESCRIPTION OF THE INVENTION

Figure 1:
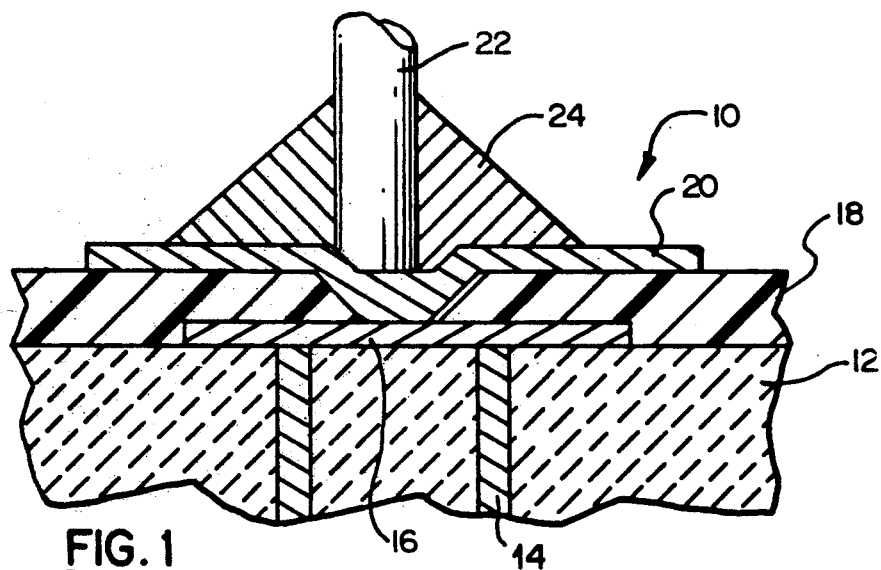
FIG. 1 is a partial cross-sectional view of a prior art embodiment of a pin bonded to the bottom surface of a ceramic substrate.

Referring to the drawings in more detail, and particularly referring to FIG. 1, there is shown a partial cross-sectional view of a prior art embodiment 10, of a pin bonded to the bottom surface of a ceramic substrate. Thus, in the embodiment 10 of FIG. 1, there is a ceramic substrate 12 having a via 14. Usually there will be a plurality of such vias. On top of the vias 14 is a capture pad 16. The capture pad 16 is typically made from a multilayer series of metallic materials starting from, for example, chromium as the adhesion layer bonded to the ceramic followed by subsequent layers of copper then chromium. Thereafter a polymeric stress relief layer 18 is deposited over the capture pad 16. The stress relief layer 18 may be, for example, laser ablated to create a via opening. Then the I/O bonding pad 20 metallurgy is deposited on the stress relief layer 18 so as to make contact with the capture pad 16. The I/O bonding pad 20 is typically made up of a multilayer series of metallic materials consisting of first chromium and then followed by subsequent layers of copper, titanium and gold. The structure 10 is completed by bonding a pin 22 to the I/O bonding pad 20 with braze material 24.

It should be noted that the embodiment in FIG. 1 and all subsequent embodiments are shown inverted for the sake of clarity; that is, the bottom surface of the structure is actually shown on the top. It should be understood that the invention is directed to the bonding of pins to the bottom surface of a ceramic substrate.

Figure 2:
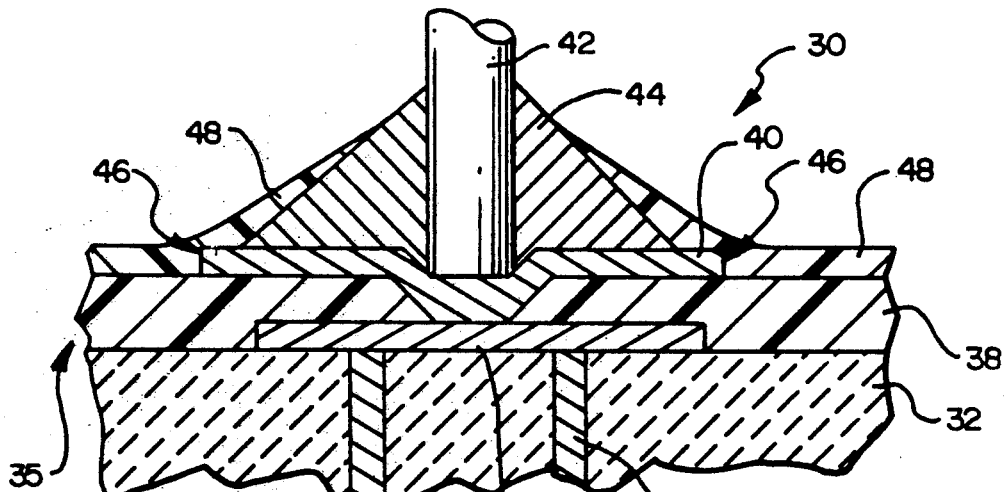
FIG. 2 is a partial cross-sectional view of a first embodiment according to the invention showing the protective layer.

Referring now to FIG. 2, there is shown a partial cross-sectional view of a first embodiment 30 according to the present invention. Thus, there is a ceramic substrate 32 having a plurality of electrically conducted vias 34 extending to a bottom surface, generally indicated by 35, of a substrate. The ceramic substrate may be a single monolithic ceramic substrate. However, it is contemplated for purposes of the present invention that the ceramic substrate is a multilayered ceramic substrate as is well known by those skilled in the art. It should be understood that this invention is directed to both the multilayered ceramic substrates and the monolithic ceramic substrates. The ceramic material may be any of the ceramic materials that are well known to those skilled in the art including alumina, borosilicate glasses, glass ceramics, mullite, etc.

There is an electrically conductive, more specifically a metallic capture pad 36 on the bottom surface 35 of the ceramic substrate. The metallic capture pad 36 is in electrical contact with at least one of the vias 34. As shown in FIG. 2, the capture pad is actually in contact with two vias. This is commonly done for I/O pads. However, it should be understood that the capture pad may be in contact with only one via or perhaps three vias or more. On top of the capture pad 36 is a stress relief layer 38 of polymeric material, typically a polyimide. Again, the polymeric layer is typically ablated or removed in an area over the capture pad to allow contact of subsequent layers of metallization with the bonding pad. Thereafter, an electrically conductive metallic I/O bonding pad 40, preferably a multilayer metallic pad, is deposited over the stress relief layer 38 of the polymeric material and is electrically connected to at least one of the vias through the capture pad 36. Finally, a pin 42 is brazed to the I/O pad 40. The braze typically forms a fillet 44 as shown.

As discussed briefly above, the inventors have discovered that a premature cause of failure of the ceramic substrate is due to corrosion of the I/O bonding pad 40. Further, the inventors have discovered that the corrosion starts at the edge 46 of the I/O bonding pad that would normally be exposed to the surrounding atmosphere. Now, this I/O bonding pad 40 may be made of, for example, successive layers of chromium, copper, titanium and gold, with gold being the outermost or topmost layer. While not wishing to be held to any particular theory, it is believed that the corrosion of the I/O pad 40 occurs by a galvanic corrosion mechanism wherein the less noble metals, chromium and titanium become anodic to the more noble materials, copper and gold, in the metal sandwich in the presence of an electrolyte such as water. In this situation, the chromium and/or titanium layers corrode, thereby undermining the mechanical and electrical integrity of the I/O pad to the substrate interface.

Accordingly, in an effort to stop this corrosion, the present inventors have provided a protective layer 48 of polymeric material encapsulating the bottom surface 35 of the ceramic substrate and the I/O pad 40. The protective layer 48, also, at least partially encapsulates the braze fillet 44. In this way the protective layer 48 serves to protect the I/O pad, particularly the edge 46 of the I/O pad from corrosion. As can be seen in FIG. 2, it is apparent that the protective layer 48 of polymeric material covers the edges 46 of the I/O bottom pad which would normally be exposed to the surrounding atmosphere.

It should be understood that while this invention is particularly advantageous for protecting I/O pads that comprise multiple layers of metallic material, the invention may also be of use where the I/O pad simply comprises a single layer of electrically conductive or metallic material wherein the material is susceptible to corrosion that is enhanced or aided by exposure to the atmosphere.

The method proposed here by the present inventors is to prevent the formation of the corrosion cells by providing a polymeric condensation barrier at the exposed edges of the I/O pads after the pins have been brazed to the I/O pads. The polymeric material chosen should have good adhesion to the underlying layers, for example, the polyimide stress relief layer 48 as shown in FIG. 2. The protective layer of polymeric material should also have good adhesion to the exposed edges 46 of the I/O bonding pad. The protective layer of polymeric material should also have low permeability to moisture and to deleterious contaminants such as chlorine. Many materials satisfy these requirements; however, the polyimide materials are preferred because they satisfy the above requirements in addition to having the requisite thermal and mechanical stability required for these ceramic substrates as contemplated by the present inventors. There are numerous polyimide materials which may be used in the present invention.

Some of the polyimides useful in the present invention include the BPDA-PDA, BPDA-ODA and BTDA-ODA type polyimides, with the BPDA-PDA type polyimide being the most preferred. The polyimides may also be preimidized if desired. Esters of polyamic acid, for example of the PMDA-ODA type, are also suitable. For examples of the latter, see Diller et al. U.S. Pat. No. 4,849,501, the disclosure of which is incorporated by reference herein. Newer polyimides include fluorinated polyimides, silicon/polyimide copolymers and acetylene terminated polyimides. Polymeric materials other than polyimides include benzocyclobutene-based resins, polyquinolines and fluorinated polyquinolines.

As practiced by the present inventors, the protective layer is applied to the substrate and then the semiconductor devices are joined to the ceramic substrate. It is necessary, therefore, that the applied polymeric material be able to withstand the thermal requirements of chip joining without degradation of its properties. Consequently, the above polyimide materials are preferred in part because of their ability to survive chip joining without degradation of their properties.

The invention may also be practiced by applying the protective layer after chip joining. In this situation, polymers that can be cured at lower temperatures such as polyimide siloxanes, liquid crystal polyesters and fluorinated thermoplastics (e.g. polytetrafluoroethylene) may be utilized.

It should be understood that the foregoing lists of polymeric materials are for purposes of illustration only and not limitation.

It is also important, no matter whether the protective layer is applied before or after chip joining, that the protective layer be reworkable. That is, it must be able to be removed without causing damage to the remainder of the substrate and pins. The requirement for reworkability necessarily eliminates materials such as the epoxies. The preferred polyimides are reworkable up until the final bake.

The polymeric protection layer has to be applied in such a way as to effectively coat the pin fillet region 44 without coating the shanks of the I/O pins 42 themselves. The preferred method for coating is to dispense the polymeric material dissolved in a suitable solvent. For example, where the polymeric material is polyimide, the suitable solvent is N-methyl pyrrolidone (NMP). The polymeric material is dispensed in between the rows of pins using a suitable nozzle attached to a hypodermic syringe followed by spinning the coated part at low revolutions per minute to ensure that the dispensed polyimide wraps around the fillets. The viscosity of the polyimide is adjusted to yield a polyimide layer of the required thickness approximately 1 to 10 microns and to have good coating characteristics. The low speed spinning, while ensuring that the braze fillet gets coated, avoids the excessive climb of the protective polymeric layer along the pin shank. Once the optimum viscosity and spinning speed of the protective polymeric layer dispensation method are determined by trial and error, the coating procedure can be automated for rapid processing of the parts using either a programmed nozzle movement or programmed movement of a table below a fixed nozzle.

Figure 3:
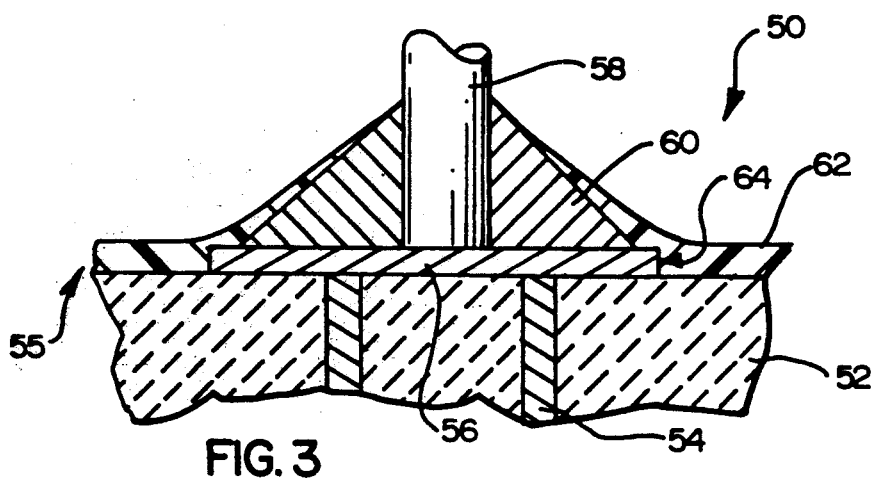
FIG. 3 is a partial cross-sectional view of a second embodiment according to the invention showing the protective layer.

Referring now to FIG. 3, there is a further embodiment 50 of the invention according to the present inventors. Again, there is a ceramic substrate 52 having a plurality of electrically conductive vias 54 extending to a bottom surface, generally indicated by 55, of the ceramic substrate 52. Onto the bottom surface 55 of the ceramic substrate is deposited a multilayer metallic I/O pad 56 which is in electrical contact with at least one of the vias 54. As before, this multilayer metallic I/O pad may be made from a plurality of materials, starting for example, from chromium and then followed by subsequent layers of copper, titanium and gold. It should be understood, however, that this combination of metallization layers is only for purposes of illustration and not limitation and that other combinations of metallization layers may be used. Finally, an I/O pin 58 is brazed to the I/O pad 56. The brazing again forms the fillet 60.

Normally, according to the present art, the edges 64 of the I/O pad would be exposed to the environment. According to the present invention, however, there is a protective layer 62 of polymeric material which encapsulates the bottom surface 55 of the substrate and also the I/O pad 56 and, particularly, the edge 64 of the I/O pad. The protective layer 62 also at least partially encapsulates the braze fillet 60. It is important that the protective layer of polymeric material not progress to the shank of the pin as discussed earlier. The layer of polymeric material 62 protects the I/O pad 56 from the corrosive effects discussed earlier. As with the previous embodiment discussed with respect to FIG. 2, the preferred polymeric material is a polyimide of the types discussed previously.

As can be seen from FIGS. 2 and 3, the I/O pad is larger in cross-section than the I/O pin.

As mentioned earlier, the polymeric protection layer should not coat the shanks of the I/O pins. The presence of the polymeric protection layer on the pin shanks is unacceptable as electrical contact cannot be established. Attempts to remove this errant polymeric protection layer by chemical means, such as by attack with NMP, have not met with success. It has been found, however, that plasma ashing works well in removing the undesired polymeric protection layer from the pin shanks. Any plasma that attacks the polymeric protection layer should work. Thus, it has been found that an O₂ plasma works well. Other plasmas such as CF₄ or a mixture of O₂/CF₄ should also work.

Since the plasma ashing attacks the polymeric protection layer, it is preferred that areas of the substrate that should not be ashed, which is everything but the pin shanks for purposes of the present invention, be masked off so as to protect portions of the substrate from the ashing. Any material that resists plasma ashing should be acceptable as a mask. For example, molybdenum has been found to perform satisfactorily.

The objects and advantages of the present invention will become more apparent after referring to the following examples.

EXAMPLES GROUP I

A series of experiments were conducted to determine the effectiveness of the protective layer according to the present invention on a multilayer ceramic substrate. One series of experiments, Example I, were done with no protective layer on the substrate. The remaining Examples II, III and IV all had the protective layer which was a BPDA-PDA type polyimide. It should be noted that even in those substrates of this test matrix with the protective coating, there were certain regions deliberately left without the coating for purposes of assessing, unequivocally, the effectiveness of the coating in preventing corrosion.

The protective layer was applied according to the following procedure. The bottom surface of the substrates was precleaned with deionized water, vacuum baked for 20 minutes at 140° C. and then downstream ashed to prepare the surface for maximum adhesion to the polyimide coating. The ashing was carried out in a low pressure argon and nitrous oxide plasma for 5 minutes under conditions that etch polyimide films at a rate of about 1000 Angstroms/minute. Thereafter, a fixture was applied to protect the top surface of the substrate. A1100 adhesion promoter was spin applied followed by baking at 90°–100° C. for 30 minutes. A first layer of BPDA-PDA type polyimide (PI-5811, Dupont Corporation) was applied with a hypodermic syringe to the bottom of the substrate and the substrate was then spun at 300 RPM for 30 seconds, followed by a light bake at 1490°–100° C. for 15 minutes. A second layer of the BPDA-PDA type polyimide was applied in a similar manner. Thereafter, the top surface fixture was removed. The substrate was given a final bake at 300° C. for 60 minutes.

All the samples were exposed for various lengths of time to an accelerated corrosive environment consisting of 85° C. and 81% relative humidity. Some of the samples were purposely contaminated with chlorine. The pins were tensile pulled to failure in an Instron testing machine. The normal failure mode will be the ductile failure of the pin shank. Only if the I/O pads were weakened by corrosion or other causes will non-shank fails such as pad delamination occur instead. These non-shank failures were examined for discoloration for positive assignment as corrosion fails. Further testing of the uncoated samples was discontinued after 60 hours of exposure. The results for the non-shank failures are tabulated in Table I.

As can be appreciated, every non-shank pin failure save one occurred in the uncoated, unprotected areas of the substrates, thereby demonstrating the efficacy of the present invention.

TABLE I

| | EXAMPLES I | EXAMPLES II | EXAMPLES III | EXAMPLES IV |
|---|---|---|---|---|
| BPDAPDA Coating | NONE | YES | YES | YES |
| Chlorine contamination | 10 ppm | NONE | 30 ppm prior to coating | 30 ppm after coating |
| PIN PULL PRIOR TO T & H EXPOSURE | | | | |
| #FAILURES/#PINS | 0/225 | 0/225 | 0/225 | 0/225 |
| 24 HRS. PIN PULL | | | | |
| #FAILURES/#PINS | 23/225 | 0/225 | 0/225 | 3/225 |
| #Fails in uncoated areas | 23 | 0 | 0 | 3 |
| 60 HRS. PIN PULL | | | | |
| #FAILURES/#PINS | 22/200 | 1/224 | 0/225 | 1/224 |
| #Fails in uncoated areas | 22 | 1 | 0 | 1 |
| 120 HRS. PIN PULL | | | | |
| #FAILURES/#PINS | — | 0/225 | 3/200 | 6/225 |
| #Fails in uncoated areas | — | 0 | 3 | 6 |
| 160 HRS. PIN PULL | | | | |
| #FAILURES/#PINS | — | 0/225 | 28*/912 | 22/903 |
| #Fails in uncoated areas | — | — | 27* | 22 |

*Indeterminate mode of failure for 28th pin.

Subsequent tests on substrates in which all regions of the bottom surface of the substrates were coated showed no non-shank pin failures relating to corrosion, even where several thousand pins were protected, thereby further demonstrating the efficacy of the present invention.

EXAMPLES GROUP II

A series of substrates samples were prepared in the manner of EXAMPLES I, except that all the samples had the polymeric protection layer, which was a BPDA-PDA type polyimide. Each of the substrate samples had over 2700 I/O pins, which were found to be contaminated with the polymeric protection layer.

The samples were prepared by placing a perforated 0.006 inch thick molybdenum mask over the pinned side of each of the samples, with the pins protruding through the perforations of the mask. The pins were of 0.013 inch diameter while the perforations were of 0.030 inch diameter. Then, the substrate samples with mask were placed in a Drytek Quad RFI (Radio Frequency Inductively Coupled) plasma tool. The operating conditions were 35 mTorr, 500 Watts, 25 sccm O₂ for 5 minutes. Subsequent to O₂ plasma ashing, the molybdenum mask was removed.

After the O₂ plasma ashing operation, the pin shanks were examined for the presence of polyimide. It was determined that the polyimide was completely removed from the pin shanks but was left intact near the braze area. Electrical continuity tests verified this result.

It is important to note that no significant undercut below the mask opening was observed. This is required to assure the presence of the protective polyimide coating at the I/O pad.

Subsequently, these substrates were exposed to an accelerated corrosive environment and chlorine contamination as described in Example Group I. Pin tensile results on these substrates were similar to that of Examplex II, III and IV of Table I.

These tests demonstrated that the O₂ plasma ashing leaves intact the protective polyimide coating at the I/O pad and removes the polyimide from the pin shank thereby enabling electrical contact to be made.

It will be obvious to those skilled in the art having regard to this disclosure that other modifications of this invention beyond those embodiments specifically described here may be made without departing from the spirit of the invention. Accordingly, such modifications are considered within the scope of the invention as limited solely by the appended claims.

What is claimed is:

1. A ceramic substrate having a protective coating on at least one surface thereof comprising:
   a ceramic substrate having at least one electrically conductive via extending to a surface of said substrate;
   an electrically conductive I/O pad electrically connected to said at least one via, wherein said I/O pad is susceptible to corrosion that is enhanced or aided by exposure to the atmosphere;
   an I/O pin brazed to said I/O pad, wherein said I/O pad is larger in cross-section than said I/O pin, said brazed pin having a braze fillet; and
   a protective layer of polymeric material fully encapsulating said I/O pad, wherein said layer of polymeric material protects said I/O pad from corrosion.

2. The ceramic substrate of claim 1 wherein said polymeric material encapsulates at least a portion of said surface of said substrate.

3. The ceramic substrate of claim 1 wherein said polymeric material encapsulates at least a portion of said braze fillet.

4. The ceramic substrate of claim 1 wherein said surface is a bottom surface of said substrate.

5. The ceramic substrate of claim 1 wherein said ceramic substrate is a multilayer ceramic substrate.

6. The ceramic substrate of claim 1 wherein said electrically conductive I/O pad is a multilayer metallic I/O pad.

7. The ceramic substrate of claim 6 wherein said I/O pad comprises successive layers of chromium, copper, titanium and gold wherein said gold layer is the outermost layer.

8. The ceramic substrate of claim 1 wherein said protective polymeric material comprises a polyimide material.

9. The ceramic substrate of claim 4 wherein said polyimide material is selected from the group consisting of BPDA-PDA, BPDA-ODA, PMDA-ODA and BTDA-ODA type polyimides.

10. The ceramic substrate of claim 5 wherein said polyimide is a BPDA-PDA type polyimide.

11. A ceramic substrate having a protective coating on at least one surface thereof comprising:
    a ceramic substrate having at least one electrically conductive via extending to a surface of said substrate;
    an electrically conductive capture pad on said surface and in electrical contact with said at least one via;
    a stress relief layer of polymeric material on said surface and disposed over said electrically conductive capture pad;
    an electrically conductive I/O pad disposed over said stress relief layer of polymeric material and electrically connected to said at least one via through said capture pad, wherein said I/O pad is susceptible to corrosion that is enhanced or aided by exposure to the atmosphere;
    an I/O pin brazed to said I/O pad, wherein said I/O pad is larger in cross-section than said I/O pin, said brazed pin having a braze fillet; and
    a protective layer of polymeric material fully encapsulating said I/O pad, wherein said layer of polymeric material protects said I/O pad from corrosion.

12. The ceramic substrate of claim 11 wherein said polymeric material encapsulates at least a portion of said surface of said substrate.

13. The ceramic substrate of claim 11 wherein said polymeric material encapsulates at least a portion of said braze fillet.

14. The ceramic substrate of claim 11 wherein said surface is a bottom surface of said substrate.

15. The ceramic substrate of claim 11 wherein said ceramic substrate is a multilayer ceramic substrate.

16. The ceramic substrate of claim 11 wherein said electrically conductive I/O pad is a multilayer metallic I/O pad.

17. The ceramic substrate of claim 16 wherein said I/O pad comprises successive layers of chromium, copper, titanium and gold wherein said gold layer is the outermost layer.

18. The ceramic substrate of claim 11 wherein said protective polymeric material comprises a polyimide material.

19. The ceramic substrate of claim 18 wherein said polyimide material is selected from the group consisting of BPDA-PDA, BPDA-ODA, PMDA-ODA and BTDA-ODA type polyimides.

20. The ceramic substrate of claim 19 wherein said polyimide is a BPDA-PDA type polyimide.

21. A method of protecting a ceramic substrate from corrosion, the ceramic substrate of the type having a plurality of electrically conductive vias extending to a surface of the substrate, a multilayer metallic I/O pad electrically connected to at least one of the vias, the I/O pad being susceptible to corrosion that is enhanced or aided by exposure to the atmosphere, and an I/O pin brazed to the I/O pad, the brazed pin having a braze fillet, the method comprising the step of:
    encapsulating fully the I/O pad with a protective layer of polymeric material, wherein said layer of polymeric material protects the I/O pad from corrosion; and
    plasma ashing the pin to remove any polymeric material which might be present on the pin.

22. The method of claim 21 wherein the step of encapsulating includes encapsulating at least a portion of the surface of the substrate with said protective layer of polymeric material.

23. The method of claim 21 wherein the step of encapsulating includes encapsulating at least a portion of the braze fillet with said protective layer of polymeric material.

24. The method of claim 21 wherein said protective polymeric material comprises a polyimide material.

25. The method of claim 24 wherein said polyimide material is selected from the group consisting of BPDA-PDA, BPDA-ODA, PMDA-ODA and BTDA-ODA type polyimides.

26. The method of claim 25 wherein said polyimide is a BPDA-PDA type polyimide.

27. The method of claim 21 wherein the multilayer metallic I/O pad is protected during said plasma ashing step.

28. The method of claim 27 wherein the multilayer metallic I/O pad is protected by a perforated mask placed over the pinned side of the substrate.

29. The method of claim 28 wherein the perforated metal mask is made of a material that is resistant to plasma ashing.

* * * * *